(12) United States Patent
Peter

(10) Patent No.: US 6,188,582 B1
(45) Date of Patent: Feb. 13, 2001

(54) FLEXIBLE INTERCONNECTION BETWEEN INTEGRATED CIRCUIT CHIP AND SUBSTRATE OR PRINTED CIRCUIT BOARD

(76) Inventor: Geoffrey Peter, P.O. Box 219191, Portland, OR (US) 97225

(*) Notice: Under 35 U.S.C. 154(b), the term of this patent shall be extended for 0 days.

(21) Appl. No.: 09/215,802

(22) Filed: Dec. 18, 1998

(51) Int. Cl.[7] ..................................................... H05K 1/18
(52) U.S. Cl. ........................ 361/760; 361/783; 361/776; 257/703; 257/778; 257/720; 439/66; 439/91
(58) Field of Search ..................... 361/760, 762, 361/783, 773, 774, 776, 707; 257/703, 720, 778; 439/66, 91

(56) References Cited

U.S. PATENT DOCUMENTS

| | | | |
|---|---|---|---|
| 5,019,944 | * 5/1991 | Ishnii et al. | 361/783 |
| 5,170,329 | 12/1992 | Purdes | 361/400 |
| 5,286,417 | * 2/1994 | Mahmoud et al. | 252/518 |
| 5,431,571 | * 7/1995 | Hanrahan et al. | 439/91 |
| 5,624,268 | * 4/1997 | Maeda et al. | 439/66 |
| 5,801,447 | 9/1998 | Hirano | 257/778 |
| 5,805,424 | * 9/1998 | Purinton | 361/760 |
| 5,805,425 | * 9/1998 | Peterson | 361/769 |

OTHER PUBLICATIONS

IBM Technical Disclosure Bulletin vol. 30, No. 9, p. 353, Feb. 1988.*
IBM Technical Disclosure Bulletin vol. 27, No. 8 p. 4855, Jan. 1985.*
Article in "The Economist", Dec. 5, 1998, pp. 100–102 "New balls, please".
Additional references on pp. 2 and 3.

* cited by examiner

Primary Examiner—Jeffrey Gaffin
Assistant Examiner—David Foster
(74) Attorney, Agent, or Firm—Liebler, Ivey & Connor; Floyd E. Ivey

(57) ABSTRACT

A flexible integrated circuit mounting apparatus and method for mounting a chip on a printed circuit board directed to the reduction of stresses within the mounting or interconnection medium, caused principally by a mismatch of the coefficient of thermal expansion between the chip circuit and the printed circuit board, and thus reduction of the likelihood of interconnection failure between the chip and the particular surface or device to which an interconnection is made.

15 Claims, 7 Drawing Sheets

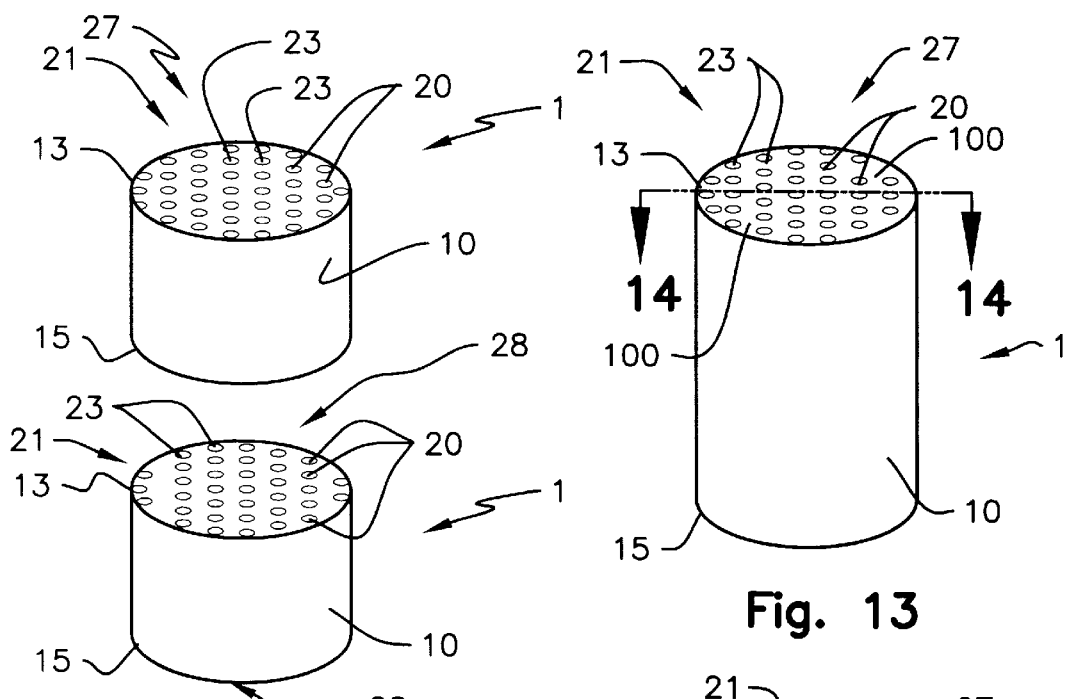
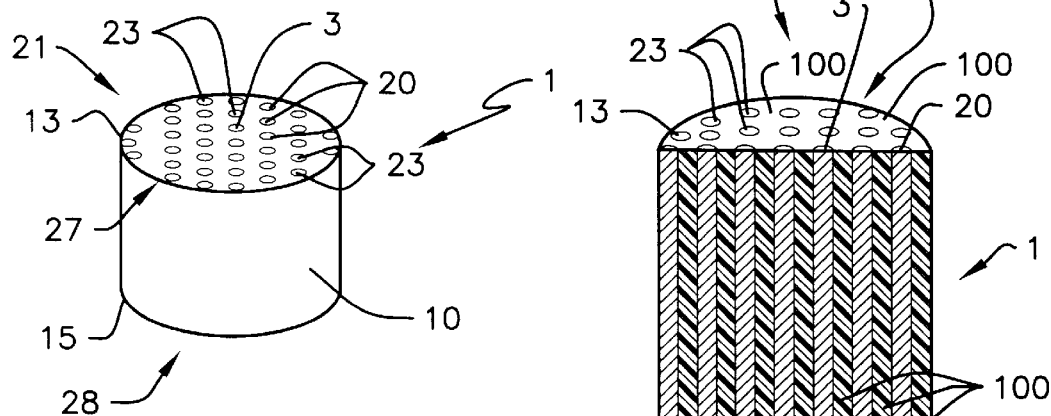
Fig. 12
Fig. 13
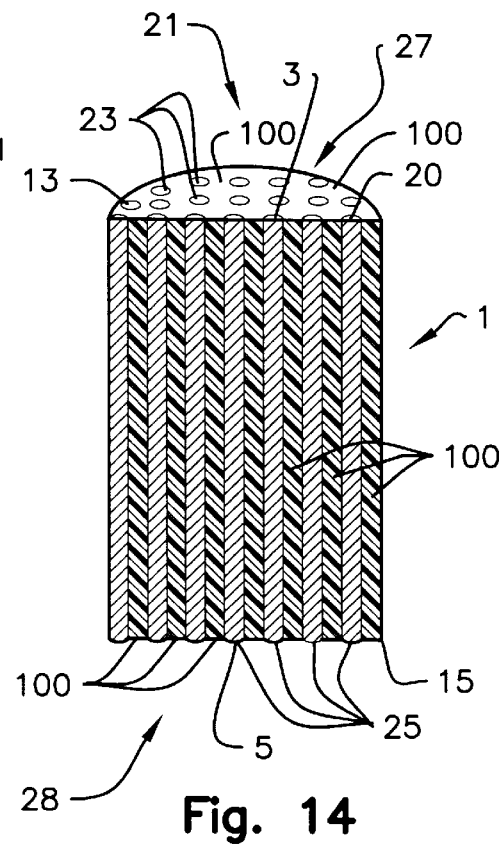
Fig. 14

FLEXIBLE INTERCONNECTION BETWEEN INTEGRATED CIRCUIT CHIP AND SUBSTRATE OR PRINTED CIRCUIT BOARD

FIELD OF THE INVENTION

The disclosed invention relates to the interconnection of integrated circuit chips with various surfaces including, primarily, printed circuit boards. The invention concerns in particular the method of interconnection of chips and a printed circuit board. More particularly the invention regards an apparatus and a method directed to the reduction of stresses within the interconnection medium or apparatus and thus the reduction of the likelihood of interconnection failure between the chip and the particular surface or device to which a chip interconnection is made.

BACKGROUND OF THE INVENTION

The trend in the semiconductor industry is the development of submicron level integrated circuits (IC or chip). The use of the IC involves interconnection between the IC and the surface or device where it is positioned. Interconnection include silicon chip connection between chip and lead frame or board; printed wiring connecting individual components; and interconnection between printed wiring boards. Of these interconnections, chip to board interconnection failure is the cause of the majority of failures of electronic systems or devices. Of interconnection failures, solder related interconnection failures are the largest contributors to electronic package failure.

Interconnection provide mechanical, thermal, and electrical functions in the electronic package. Various technologies have been developed to solve this problem of interconnection between chips and the chip and the circuit board. The pin in hole or pin through hole was the traditional method, until the late 1980's when the surface mount technology was introduced. The introduction of the surface mount technology revolutionized the electronic packaging industry. Surface mount technology includes flip chip, chip-on-chip, tape automated bonding, ball grid array and multi-chip module. Each of these techniques differ in its circuitry design and interconnections. U.S. Pat. No. 5,801,447 to Hirano et al., a flip chip mounting type device having a gate region for injection of a sealing member filled between a mounted board and the chip.

Solders have been successfully used for interconnections. Solder fluxes and solder powders have been combined into paste and is easily applied to component foot print areas. Various interconnection methodologies such as vapor phase, convection, laser, infrared, and hot-bar reflow are in use today. With the surface mount technology solder interconnection will continue to be the most reliable, with case of interconnection, and cost effective method. However, failure in solder interconnection are due to the following: mechanical failure due to weakness in material strength, surface tension effect, high temperature creep and plastic deformation, excessive void, intermetallic compound formed at interfaces, the development of damaging microstructures, fatigue failure due to corrosion, and mismatch in coefficient of thermal expansion (CTE).

The joint material causes serious failure due to stress as a result of CTE mismatch. The thermal environment experienced by electronic circuits varies greatly encompassing a range of −50 degrees to +200 degrees F., or more. The CTE of plastic/ceramic is approximately 20 times the CTE of the silicon chip. One solution is to use strain buffers between the low CTE silicon and the high CTE metal. At present solders will strain buffers such as copper and molybdenum are in use. The strain at the solder joints due to temperature change, and fatigue failure of solder interconnections remain high. U.S. Pat. No. 5,170,329 to Purdes discloses a chip mount to reduce stresses caused by thermal expansion mismatch between chip and printed circuit board including a strip member secured to the chip and a guide layer secured to the circuit board.

Typically a packaging scheme may require high heat removal, combined with low stress at the interconnection between chip and board. Thus the interconnection materials should have high thermal conductivity to dissipate heat produced by the chips, with close match between the CTE of the chip and the substrate to minimize thermal stress. However, most of the work in electronic packaging is concerned with packaging schemes rather than materials. The chip or die is attached to the substrate or printed circuit board (PCB) on which interconnection lines have been written (usually by screen printing) on each layer of multilayer substrate or board. In the first level packaging the chip (or chips) may be attached to substrate via soldered joints and the substrate attached to the PCB via soldered joints. In the direct chip attach module (DCAM), the chip is attached directly to the PCB. In the multichip module laminate (MCML), the chip is attached via cardlet, with one or many card attached to a large card. The MCML allows for denser packaging. In surface mount technology (SMT) the surface patterns of conductors are connected electrically without employing holes. Solder is used to make electrical connection between the surface mount package (leaded or leadless) and a circuit board. An examination of conventional pin-through-hole (PTH) technology and high density packaging based on surface mount technology (SMT) provides clues as to the failure mechanism.

One approach to meet the needs of advanced material in electronic packaging is to create new composite materials. Composite materials consists of two or more constituents, with each one maintaining distinct properties and regions. Accordingly alloys are not composites.

One of the well-established composite is the glass fiber reinforced polymer (GFRP) for printed circuit boards. However the recent advanced composites provide unique advantages by being able to tailor their CTE, with high thermal conductivity, low density, and with high strength, and stiffness. At present, the leading composites of interest for applications such as heat sinks and packages are carbon fiber reinforces epoxy (C/Ep), carbon fiber reinforced aluminum (C/Al), carbon fiber reinforced copper (C/Cu), boron fiber reinforced aluminum(B/Al) and silicon carbide particle reinforced aluminum(SiC)-p/Al). Fiber reinforced composites are strongly anistropic; their properties depend strongly on fiber direction. In contrast, monolithic and particle reinforced metals tend to be isotropic; their properties are the same in every direction. Mechanical and physical properties of fiber reinforced materials can be tailored over wide ranges by selection of fiber, matrix, fiber volume fraction, and fiber orientations. It is known that the isotropic inplane CTE of copper reinforced with a variety of pitch-based carbon fibers varies with fiber volume fraction. By varying fiber volume fraction, Vf, it is possible to match the CTE of virtually all materials of interest, including silicon, gallium arsenide, alumina, beryllia and aluminum nitride. The inplane thermal conductivity of C/Cu composites vary with Vf. Note they are much higher than those of conventional packaging materials with low CTE's. Through-thickness conductivities are also high. The CTE and thermal conductivity of carbon fiber reinforced aluminum vary with fiber volume fraction.

Another important composite material is reinforcing aluminum alloys with silicon carbide particles. The purity of SiC plays an important role here, and high purity particles have higher thermal conductivities.

The most common composites consists of a matrix reinforced with continuous or discontinuous fiber whiskers, or particles. The four key classes of composites are polymer-matrix composites (PMC's), metal matrix composites (MMC's), ceramic-matrix composites (CMC's) and carbon/carbon (C/C) composites. In addition, there are composites in which the phases have amorphous geometries. For example, some circuit breaker contacts are made by infiltrating silver into a porous preform made by sintering tungsten particles, in essence a metal/metal composite.

The problem associated with brazes and solders can be alleviated by the use of composites brazes or solders which contain a filter of low CTE. Graphite is a suitable filler for alloys typically used for brazing and soldering, such as silver-based braze alloys and tin-based solder alloys. Carbon fibers have been successfully used as a filler for both brazes and solders. Either short or continuous carbon fibers can be used. Short fibers are needed if the solder or braze is to be applied in the form of a paste. Continuous fibers are more effective than short fibers in decreasing the CTE, but they cannot be in a paste form and are thus limited to applications in solder/braze preforms.

Polymers are used as adhesives for attaching a die to a substrate. Due to the low CTE of the die and the substrate, a low CTE is desired for the adhesive. A filler of low CTE can be added to the polymer for this purpose. Because of the need to dissipate heat from the die and because polymers are in general thermal insulators, the filler is preferably a thermal conductor. Graphite and AlN are thus suitable fillers.

Solders in the form of solder pastes compete with polymer adhesives for use as screen printable die attach. The attraction of solders lies in their high thermal conductivity. Like polymeric adhesives, solders suffer from a high CTE. Solders suffer in particular because they are fatigued by thermal stresses arising from CTE mismatches. Use of an active (titanium-containing) solder together with a low CTE filler (such as molybdenum particles) alleviates CTE mismatch but it makes the solder less ductile.

Problem Definition

Chip Size, Type of Solder and Fatigue Failure

In industry today two types of solders are used, soft and hard solder. Hard solder consists of Au—Sn, Au—Ge, and Au—Si. Hard solder has a low melting point, with a relatively long fatigue life. However hard solder is expensive and it is only used for chip sizes smaller than 0.25 in. Since the chip is small the differential expansion between the copper and the silicon is small and thus the stress is reduced, with relatively long fatigue life. Due to the cost, even in this case soft solder is used. Soft solder consists of Pb, Sn, In, Ag, Bi, and Cd. They are low cost and also have a low yield stress at low temperature. They plastically deform and have a low fatigue life. Soft solder is normally used for chip sizes between 0.25 in and 1.00 in. If chip sizes are greater than 1.00, then there are two approaches. One is to parallel two chips of half the size, which reduces the thermal expansion stress. However due to close proximity of many joints and power cycling they have electrical failures. The other approach is in the use of low expansion materials such as W, or Mo. How ever the surface still rub against each other due to CTE mismatch, and fatigue failure occurs.

Solder Stress Induced During Assembly

It is well understood that the elements of an electronic package are fabricated forms that are mechanically joined at one temperature and then exposed to different temperature in use. Owing to the differing CTE, the joined materials are subjected to thermal stresses that can fracture component to carrier interface joints causing mechanical and electrical failure. Silicon has a low CTE, compared to the CTE of other packaging materials. During manufacture the temperature is normally raised to 400F. for solder reflow and then cooled to room temperature. This temperature change introduces strain at the solder joints and stress in the components before being used.

Package Distortion Due to Temperature Gradient; (Pure Shear Strain vs Tensile Force)

How rigidly the package is clamped to the heat sink determines the type of strain induced in the solder joints due to the temperature gradient. In FIG. 1, the package is rigidly clamped, and the solder joint is subjected to a shear dominance strain field. In FIG. 2, the package is not rigidly clamped, hence the solder joint is subjected to a perpendicular force in addition to the in plane shear strain. This results in bowing of the electronic component. Note FIGS. 1 & 2 are highly magnified. U.S. Pat. Nos. 4,973,527; 4,262,412; 4,414,418 and 5,098,798 address the formation of fiber bundles.

SUMMARY OF THE INVENTION

Discrete Contact Between Chip and Board

This disclosure is of an interconnection apparatus and an interconnection method for the mounting of a chip on a printed circuit board where the apparatus is comprised of a bundle of fibers. Additionally disclosed is the configuration of the bundle of fibers composing a composite material formed of the bundle of fibers contained within an insulation matrix wherein each discrete fiber constitutes both a portion of the interconnection bundle, as an interconnection medium between chip and PCB, and one or a plurality of the fibers compose one or a plurality of signal conductors between one or a plurality of signal connections at a chip and one or a plurality of electrical connections at a PCB. The disclosure is additionally of a bundle first end and plurality of fibers first end affixed by means to a chip, having a chip mounting surface, at the chip mounting surface; a bundle second end and plurality of fibers second end affixed by means to a PCB, having a PCB mounting surface, at the PCB mounting surface such that the plurality of fibers flexibly interconnecting the chip and PCB such that upon expansion or contraction of the chip relative to the PCB, said plurality of fibers flex to reduce stresses resulting from the expansion or contraction of the chip.

The preferred embodiment of the invention provides a flexible connection used to connect a chip to a substrate composed, for example, of a ceramic substrate or PCB. In the preferred embodiment the flexible connection or apparatus is comprised of a bundle of fibers comprised, for example of wires, formed from titanium or copper wires of diameter from 0.001" to 0.1" with the material composing the fibers and the fiber or wire diameter determined by design preference or calculation. The length of the fibers may, for example, be approximately 0.03" in length. In the preferred embodiment the bundle of fibers will be contained within a sheath composed, for example of a metal sheet or tube, formed for example from titanium or copper, having a thickness, for example, from 0.01" to 0.2" where the material selected and the thickness will be a function of design preference or calculation. Fiber and sheath material, diameter and thickness is not limited to the materials, diameters and thicknesses stated herein. The sheath is a containment means for the bundle of fibers. The sheath, the fibers and the matrix may be formed from copper, aluminum, titanium, nibium, silver, gold and other electronic materials as per design specifications. The length of the sheath may be equal to or less than the length of the fibers. The sheath may be removed following the connection of the interconnection bundle between chip and substrate. The sheath and the number and length of fibers or wires forming the interconnection will be determined by design based on the following: 1) size of the integrated circuit or chip; 2) the materials available for fiber or wire and sheath; 3) the temperature limits; 4) the height limits of the interconnection including solder; and 5) the coefficient of thermal expansion of the chip and the PCB or ceramic substrate. The preferred embodiment of the invention apparatus will be optimized, with regarding fiber or wire diameter, length and number of fibers or wires, to reduce thermal stress within the interconnection bundle due to CTE mismatch between chip and PCB.

The bundle of fibers constitutes a strain buffer between the chip and the PCB. Each individual fiber has a very small contact with the chip. Hence in relation to the chip each fiber has a very small CTE, with each fiber separating upon the occurrence of thermal stress, from other fibers, at the chip mounting surface, reducing the stress between each fiber and the chip mounting surface. FIG. 3 shows how the fibers are anticipated to the flexible due to a large temperature difference. This allows the chip size to be increased. The materials for the fibers will generally be composed of a material which will receive solder for the purpose of connection to the chip mounting surface and PCB mounting surface and, where used as signal connections, will be composed of a material having electrical conductive properties. The fibers and sheath could, for example, be copper, titanium, or silver, based on cost considerations or other materials. The sheath will not, in the preferred embodiment, be connected to the chip mounting surface or the PCB mounting surface.

The interconnection bundle will be formed generally by the assembly of a plurality of fibers or wires generally oriented in parallel with each of the fibers or wires container therein. The plurality of fibers or wires will be gathered together in a bundle and, in the preferred embodiment, enclosed with a sheath. The sheath provides a means of securing the fibers or wires during a milling or cutting process wherein the bundle is milled or machined to the length required for the bundle. The material, fiber or wire diameter and length, and number of fibers or wires within a bundle will be determined by the design parameters previously referenced. The fibers or wires are accumulated, by means. The fibers or wires at one end of the bundle are fixed by a solder means to a chip mounting surface; the fibers or wires at the other end of the bundle are fixed by a solder means to a PCB or substrate. Gathering or accumulation or assembly means will be employed to assemble the plurality of fibers or wires; rolling, die or compression means, for example, will be employed to secure the plurality of fibers or wires into a bundle which may be encompassed by enclosing or containing means including a sheath composed, for example by a metal sheet or tube; securing means will secure the sheath around the fibers or wires; milling or machining including polishing means will be employed to cut the sheath and plurality of fibers or wires to form interconnection bundles to the desired length; solder means, including for example wave solder, will affix the interconnection bundle to a chip at a chip mounting surface and a substrate or PCB at a substrate or PCB mounting surface.

The interconnection bundle is depicted in the drawings generally as cylindrical in shape and circular in cross section. However, the shape and cross section is not limited and may have other regular and irregular shapes and cross sections including, for example, square or rectangular.

Mathematical Modeling

Model Review

Computer aided measurements of thermal properties in composites and electrical modeling and simulation of interconnections are discussed in [13]]. The thermal, and stress strain are a coupled process. The model has to take into account the heat flow paths and the structural load paths through the system. Modeling of solder joints, lead wires, and plated throughholes are discussed in [[18]]. For this study the finite element code ANSYS has been selected. Nonlinear FEM would be used to improve the accuracy. Since the dimension of the chip, interconnects, board, and solder joints are really small, the element thickness becomes very small. This could produce numerical instability, due to point load, or sudden change in the boundary, or sharp corners in the structure. To avoid this the load would be spread over a closely clustered group of node points. Further two and three dimensional models would be used. Three dimensional models would be used solid (or isoparametric) types of elements, to obtain full three dimensional characteristics. Whenever possible symmetry condition would be used to reduce computer time. In order to check the accuracy of the model the results of a full three dimensional model would be compared with a 30° slice out of the symmetrical model.

The electronic component is normally subjected simultaneously to vibration and thermal cycles. Hence the effects of vibration strain, and thermal strain would be superimposed appropriately. One of the simplest and most widely used superposition scheme is Miner's rule. Miner assumes that every structural member has a useful fatigue life and that every stress cycle uses up a part of this life. When enough damage has been accumulated due to stress/strain cycling, the effective life is exhausted and the member fails. Effective superposition is possible once the strain histories from vibrational and thermal loading are quantified. Most electronic devices are subjected to random vibrations. The associated stress or strain amplitude in the solder joints can be assumed to have a Gaussian distribution about the rms amplitude near the PWB's natural frequency. For properly designed electronics, vibration strain amplitudes that exceed the 3 S values are considered to cause fatigue. Some feel that 3 S is not conservative enough and use 2.2 S. Strain amplitudes above the 3 S value occur only 0.135% of the time in the Gaussian distribution, and thus the PWB has to be designed to handle only 0.135% of the total number of vibration cycles.

Governing Equations

In Cartesian coordinates:

$$\frac{\partial}{\partial x}\left(k\frac{\partial T}{\partial x}\right) + \frac{\partial}{\partial y}\left(k\frac{\partial T}{\partial y}\right) + \frac{\partial}{\partial x}\left(k\frac{\partial T}{\partial x}\right) + q''' = \rho Cp\frac{\partial T}{\partial t};$$

In cylindrical coordinates:

$$\frac{1}{r}\frac{\partial}{\partial r}\left(kr\frac{\partial T}{\partial r}\right) + \frac{1}{r^1}\frac{\partial}{\partial \theta}\left(k\frac{\partial T}{\partial \theta}\right) + \frac{\partial}{\partial x}\left(k\frac{\partial T}{\partial x}\right) + q'''..\rho Cp\frac{\partial T}{\partial t};$$

Where:

| | |
|---|---|
| T - temperature | Cp - heat capacity |
| k - thermal conductivity | p - density |
| q''' - heat generation rate per unit volume | |

Boundary and Initial Conditions

Some of the difficulties associated with modeling thermal process comes from the high non-linearity of the problem resulting from temperature dependent material properties such as k(T), p(T), Cp(T), boundary conditions as well as heat generation rate. Specifying boundary conditions accurately is quite difficult due to high non-linear heat transfer mechanism occurring at the surface of the component, irregularities caused by intermetallic fusion as inter connections etc. A simple but efficient way uses a comprehensive boundary heat transfer parameter, generally being the overall heat transfer coefficient. It incorporates all possible heat transfer mechanisms occurring on the boundaries of the component, such as convective and radiative heat transfer. Mixed boundary condition is normally applied in modeling as follows:

$$h_o(T_{surf}-T_f)+k\partial T/\partial n_{ref}=0$$

where:

| | |
|---|---|
| $h_o$ | overall heat exchange coefficient |
| $T_{surf}$ | surface temperature |
| $T_f$ | bulk temperature |

Specifying initial conditions is normally straightforward since most equipment start with a uniform temperature such as room temperature. Generally the initial condition is expressed as follows:

$$T_1=0=f(x,y,z)$$

$$T_1=0=f(r, 0, z)$$

Strain and Solder Joint Fatigue Calculations

The strain developed in the solder joint due to thermal cycling is a key design parameter because it drives the rate of solder joint fatigue, which is the limiting life cycle factor. The Coffin-Manson fatigue relationship, in the following form gives a reasonable representative fit to experimental solder fatigue data in sheaf.

$$N_1 \cdot (v, T_{max})=C/(e^2p)v^{1/3}\exp(1.87-0.0134\ T_{max})$$

where:

| | |
|---|---|
| $N_f =$ | is the number of fatigue cycle to failure |
| $v =$ | is the cyclic frequency |
| $T_{max} =$ | is the maximum excursion temperature |
| $C =$ | is proportionality constant, approximately equal to 120 |
| $e_p =$ | is the plastic strain excursion, and is given by |
| $e_p =$ | $[L(I_U T_u - I_L T_L)]/2t \times 100, \%$ | where L is the largest dimension of the joint $I_U$ and $I_l$ are the expansion coefficient of the upper and lower materials being soldered together, respectively.

$T_U$ and $T_1$, are the corresponding temperature excursions for the upper and lower surface, respectively, and t is the solder thickness.

From the above it can be seen that the fatigue life is increased quadratically, with a decrease in the strain range.

Fatigue Life of Solder Joint

The following calculations are reproduced from reference [[18]]. Problem: A ceramic chip carrier with 44 input-output (I/O) solder pads will be mounted on a PCB that must be capable of operating over a rapid temperature cycling range from −55 to 30 105° C. Determine the solder joint shear stress for the following possible mounting configurations on a 0.060 in thick PCB, as described below.

(A) LCCC on Ordinary Epoxy Fiberglass PCB

An equilibrium equation can be set up between the ceramic chip, the ordinary epoxy, fiberglass PCB and the solder joint. As the PCB expands more than the chip in the X-Y plane, the load is transferred to the solder joints, then to the chip. This forces the solder joints to carry the load in shear, while the chip and the PCB carry the load in tension, as shown in FIG. 4. Equation 1 shows the equilibrium relation where subscripts S, C, and I' are used to represent the solder joint, the component, and the PCB displacement respectively, along the X axis.

The maximum chip expansion will occur across the diagonal dimension of the chip, since this is the largest chip dimension. However, diagonal dimensions are inconvenient to use, since all of the other dimensions must be rotated 45° to make them consistent. Therefore, for convenience, all deflections will be taken with respect to the horizontal X axis, then rotated through the 45° to obtain the maximum values.

One half of the ceramic chip assembly is evaluated by using symmetry. This means that only 21 of the 44 solder pads will be examined. Two pads are located at the center, so they are not involved in the expansion and will carry small shear loads. The centroid of the 21 solder pads on one half of the carrier can be obtained from the locations of the individual solder pads.

| | |
|---|---|
| 11 pads at 0.297 in = | 3.267 |
| 2 pads at 0.247 in = | 0.494 |
| 2 pads at 0.197 in = | 0.394 |
| 2 pads at 0.147 in = | 0.294 |
| 2 pads at 0.097 in = | 0.194 |
| 2 pads at 0.047 in = | 0.094 |
| Sum 21 pads = | 4.737 | solder centroid = 4.737/21 = 0.226 in

The displacement of the chip plus the displacement of the solder joint must equal the displacement of the PCB. The force in each member is shown by P.

$$a_c L_c \Delta 1 + \frac{P_c L_c}{A_c E_c} + \frac{P_s h_s}{A_s G_s} = a_p L_p \Delta t - \frac{P_p L_p}{A_p E_p}$$

where

-continued $a_c = 5 \times 10^{-6}$ in/in/°C. (TCE of ceramic chip carrier)

$L_c = 0.226$ in (effective length of chip carrier)

$a_p = 15 \times 10^{-6}$ in/in/°C. (TCE of PCB along the X axis)

$\Delta t = 105°$ C. $-(-55°$ C.) $= 160°$ C. (maximum temperature range)

$\Delta 1 = \dfrac{160}{2} = 80°$ C. (neutral point to maximum temperature)

$A_c = (0.010)(0.6-1) = 0.0256$ in$^2$ (carrier section area using the width of the LCCC)

$E_c = 42 \times 10^6$ lb/in$^2$ (modulus of elasticity, ceramic)

$h_s = 0.003$ in (typical height of solder joint)

$A_s = (21)(0.0-16)(0.025) = 0.0242$ in$^2$ (shear area on 21 solder pads based upon the PCB pad size)

$G_s = 1.2 \times 10^6$ lb/in$^2$ (solder shear modulus)

$L_r = 0.226$ ln (effective length of PCB in centroid)

$A_r = (0.060)(0.64) = 0.0384$ in$^2$ (area of PCB section)

$E_r = 2.0 \times 10^6$ lb/in$^2$ (PCB X − Y modulus of elasticity)

Substitute into Eq. 7.41 and solve for the force.

$(5 \times 10^{-6})(0.226)(80) + \dfrac{0.226 \, P_c}{(0.0256)(42 \times 10^6)} + \dfrac{0.003 \, P_s}{(0.0242)(1.2 \times 10^6)} =$ $(15 \times 10^{-6})(0.226)(80) - \dfrac{0.266 \, P_r}{(0.0384)(2 \times 10^6)}$ $0.0000901 + 0.00000021 \, P_c + 0.000000103 \, P_s =$ $0.0002712 - 0.00000291 \, P_r$ Considering the sum of the forces in the horizontal plane:

$P_c = P_s = P_r$ $\therefore 0.00000325 \, P = 0.0001808$ $P = 55.6$ lb (averaging force on 21 solder joints)

The average shear stress on the solder joint can be obtained from the solder joint shear area for 21 pads, conservatively ignoring any solder joint fillets.

$S_S = K P_S / A_S$      Eq. 3

A stress concentration factor (K) must always be considered when stress calculations are made for systems that must withstand more than about 5000 to 10,000 stress cycles. However, when the material is very plastic and only 1000 or 2000 stress cycles are expected, then the stress concentration is 1.0.

$S_s = 55.6/0.0242 = 2298$ lb/in$^2$ (average solder hear stress)      Eq. 4

The maximum solder joint shear stress will occur at the diagonal corner solder pads on the chip carrier. This value can be obtained by using dimensional ratios that locate the carrier corners with respect to the solder area centroid. Two ratios are involved. The first ratio locates the distance from the solder pads at the edge of the carrier, to the solder centroid. The second ratio rotates the chip carrier 45° to obtain the distance to the corner solder pads solder centroid ratio 0.297/0.226=1.314      Eq. 5 rotate 45° to corners=sqrt 2=1.414      Eq. 6

The maximum solder joint shear stress at the corners of the chip carrier can be obtained with eqs 4, 5, and 6 as follows:

$S_{Ssmax} = (2298)(1.314)(1.414) = 4270$ lb/in$^2$      Eq. 7

The approximate fatigue life of the solder determined using Eq. 8 is 30 temperature cycles.

(B) LCCC on a PCB Reinforced with Copper-Invar-Copper

When two 0.006 in thick CU-IN-CU sheets are laminated in the PCB, they will increase the effective modulus of elasticity and reduce the effective CTE. A quick approximation of these values can be obtained from their individual properties, starting with the effective CTE of the PCB.

$$\text{effective } a = \dfrac{\sum A_i E_i a_i}{\sum A_i E_i}$$

where $A_p = 0.060 - 0.012 = 0.048$ in$^2$ (PCB area for unit width without (CU-IN-CU))

$E_p = 2 \times 10^5$ lb/in$^3$ (PCB modulus of elasticity)

$a_p = 15 \times 10^{-6}$ in/in/C (TCE of PCB in X − Y plane)

$A_{CIC} = (2)(0.006) = 0.012$ ln$^2$ (CU-IN-CU unit area, 2 layers)

$E_{CIC} = 18 \times 10^6$ lb/in$^2$ (modulus of elasticity CU-IN-CU)

$a_{CIC} = 5 \times 10^{-6}$ in/in/°C. (TCE of CU-IN-CU)

Substitute into Eq. 7.48 to obtain the average combined TCE of the composite PCB with CU-IN-CU.

$$a_{1M} = \dfrac{(0.018)(2 \times 10^6)(15 \times 10^{-6}) + (0.012)(18 \times 10^6)(5 \times 10^{-6})}{(0.018)(2 \times 10^6) + (0.012)(18 \times 10^6)}$$

$a_{1F} = 8.09 \times 10^{-6}$ in/in/°C.

This represents an average CTE for the PCB. However, this average does not consider the relative position of the CU-IN-CU within the multilayer PCB. When the CU-IN-CU is closer to the outer surfaces of the PCB, where the LCCCs are mounted, then the restraining effects are much greater and the effective CTE of the PCB can be further reduced.

The thermal conductivity of CU-IN-CU is about equal to a sheet of aluminum. Therefore conduction heat transfer on the PCB can often be improved, which can reduce hot spot temperatures.

This same method can be used to find the average modulus of elasticity for the PCB with the CU-IN-CU with only the area and the modulus as follows:

$$E_{PCB} = \frac{(0.018)(2 \times 10^6) + (0.012)(18 \times 10^6)}{0.018 + 0.012} = 5.2 \times 10^6 \frac{lb}{in^2} (7.50)$$

The above relation can be used in Eq. 7.41 to find the new force acting at the solder area centroid as follows:

$$(5 \times 10^{-6})(0.226)(80) + \frac{0.226 \, P_c}{(0.0256)(42 \times 10^6)} + \frac{0.003 \, P_s}{(0.0242)(1.2 \times 10^6)} =$$

$$(8.08 \times 10^{-6})(0.226)(80) - \frac{0.226 \, P_p}{(0.0384)(5.2 \times 10^6)}$$

$$0.0000904 + .000000210 \, P_c + 0.0000001033 \, P_s =$$
$$0.0001461 - 0.000001132 \, P_t$$

But $P_C = P_s = P_p$         Eq. 10

$0.000001445 \, P = 0.0000557$         Eq. 11

$P = 38.55$ lb (average force on 21 solder joints)

Using the method outlined by Eq. 4 though 7, the maximum shear stress expected at the corner pads will be approximately as follows:

$Ssmax=38.55 \times (4270)/55.6=2960 \, lb/in2$

Using Eq. 8 with the use of the solder fatigue b exponent of 2.5

$N_i = N_2(S_2/S_1)^h$ with $N_2=250$ cycles to fail (solder reference point)
$S_2=2100 \, lb/in^2$ (solder stress reference point)
$S_1=2960 \, lb/in^2$ (maximum solder shear stress)
$N_i=250 \, (2100/2960)^{2.5}=106$ cycles to fail.

Major fracture can be expected in the solder joints after about 106 temperature cycles. More CU-IN-CU can be added to the PCB to further reduce the CTE, or a greater solder joint height should be used to improve the fatigue of the solder joints.

Numerical Approaches

There are many tools available to study thermomechanical effects of new electronic packages. Designs can be optimized for different materials properties, temperature changes, environmental effects etc. Once meaningful analytical results are obtained, then a prototype is built and tested under laboratory conditions to confirm the analytical results. Finding an appropriate way of implementing the model and achieving meaningful results is another major task of modeling analysts. The three most popular analytical methods available to engineers and designers today are hand calculations (closed form solutions), finite difference method (FDM), and finite element methods (FEM). Boundary elements (BEM) are becoming more popular these days for larger models. BEM is suppose to be 10 to 25 times faster than FEM, however it is not suppose to replace FEM, but rather to complement FEM.

The present invention discloses a method or apparatus, for the interconnection between chip and printed circuit or other structure, which reduces, over presently know methods, stress due to CTE mismatch. The benefits of this are the availability of reliable, more robust, and cost effective components for electronic packaging. The invention is an interconnection apparatus which results in lower cost, lessened thermal stress between chip and PCB with higher temperature changes, and thus higher reliability of the electronic component.

BRIEF DESCRIPTION OF THE DRAWINGS

The foregoing and other features and advantages of the present invention will become more readily appreciated as the same become better understood by reference to the following detailed description of the preferred embodiment of the invention when taken in conjunction with the accompanying drawings, wherein:

FIG. 12 is representative of a method of forming an interconnection bundle followed by separation via cutting means, including milling and machining, including polishing, means, into discrete interconnection bundles.

FIG. 13 is representative of an interconnection bundle wherein the interconnection bundle composes a composite material formed of a bundle of fibers contained within an insulation matrix wherein each discrete fiber constitutes both a portion of the interconnection bundle, as an interconnection medium between chip and PCB, and one or a plurality of the fibers compose one or a plurality of signal conductors between one or a plurality of signal connections at a chip and one or a plurality of electrical connections at a PCB.

FIG. 14 is a section from FIG. 13 showing an interconnection bundle composed of fibers having first and second ends, bundle first and second end 3, 5, plurality of fibers 21, plurality of fibers first and second end 27, 28 and insulating matrix 100.

Comparison of the PTH and SMT technology and provides clues as to the failure mechanism.

Every additional interconnection imposes a signal propagation delay which is in turn directly proportional to the square of the dielectric constant of the substrate material.

DETAILED DESCRIPTION

Figure 1:
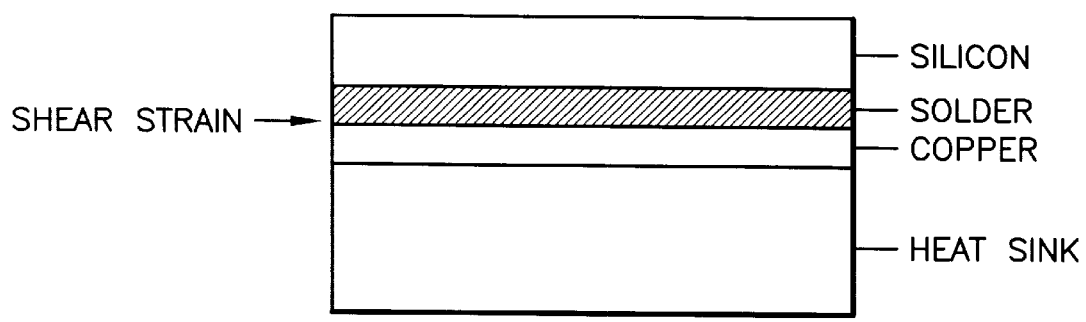
FIG. 1 illustrates shear strain in a package rigidly clamped.
Figure 2:
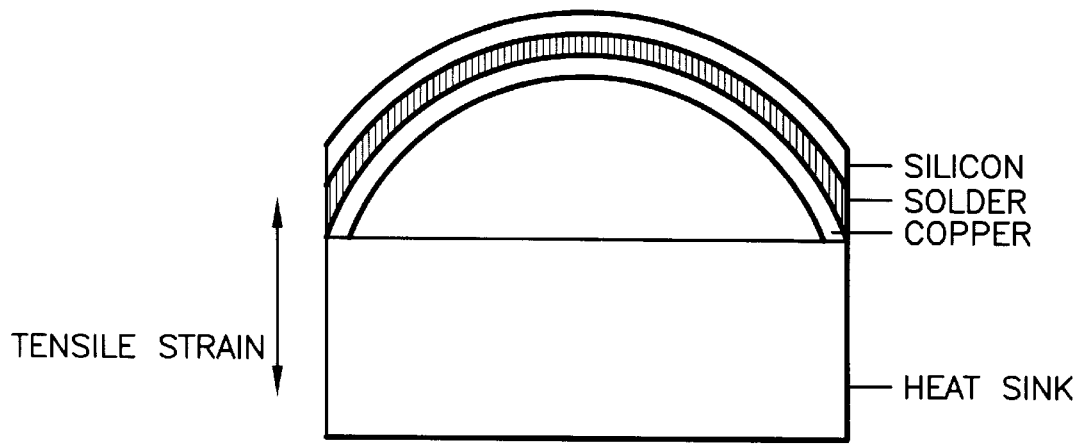
FIG. 2 demonstrates tensile strain in a package not rigidly clamped.
Figure 3:
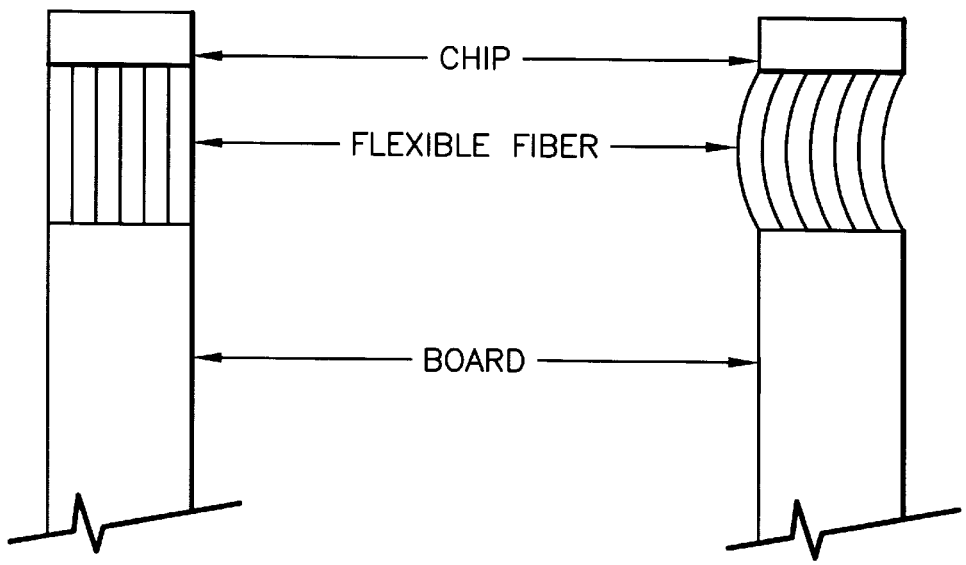
FIG. 3 shows, in the embodiment of the present apparatus of a bundle of fibers, the anticipated flexibility in fibers due to large temperature difference.
Figure 4:
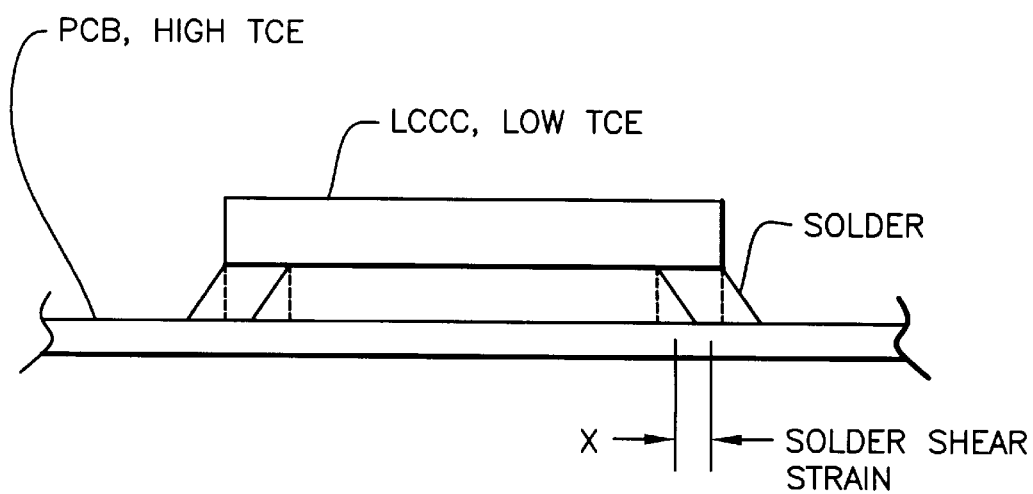
FIG. 4 demonstrates the difference in the CTE of the LCCC and the PCB force exerted on solder by shear and creep.
Figure 5:
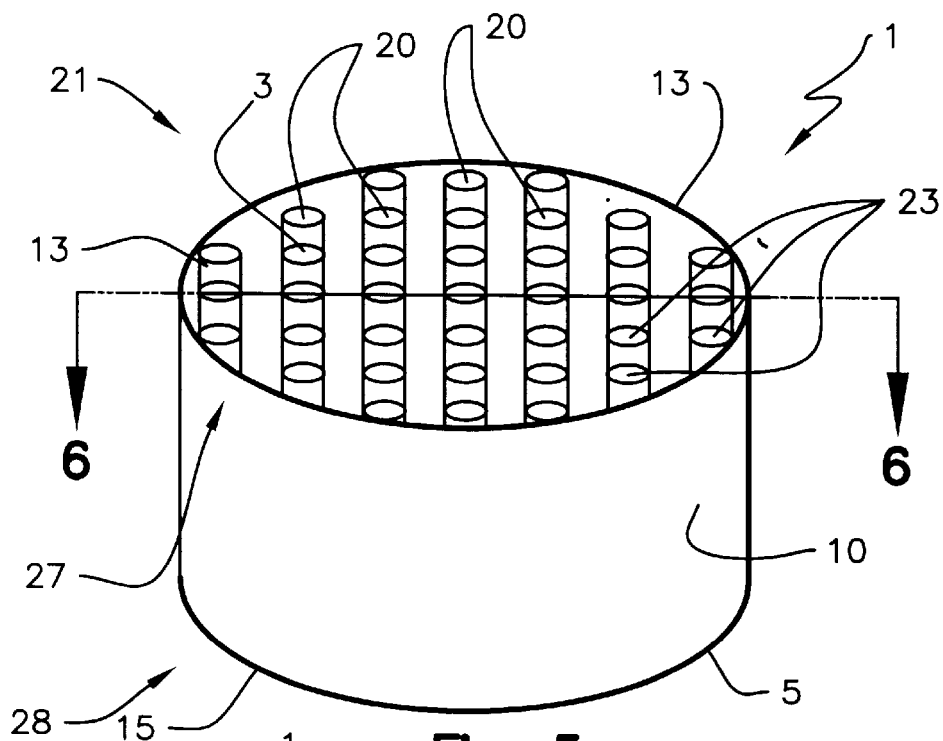
FIG. 5 is a perspective of an interconnection bundle showing a plurality of fibers contained within a sheath. Illustrated are bundle first and second ends and fiber first ends.
Figure 6:
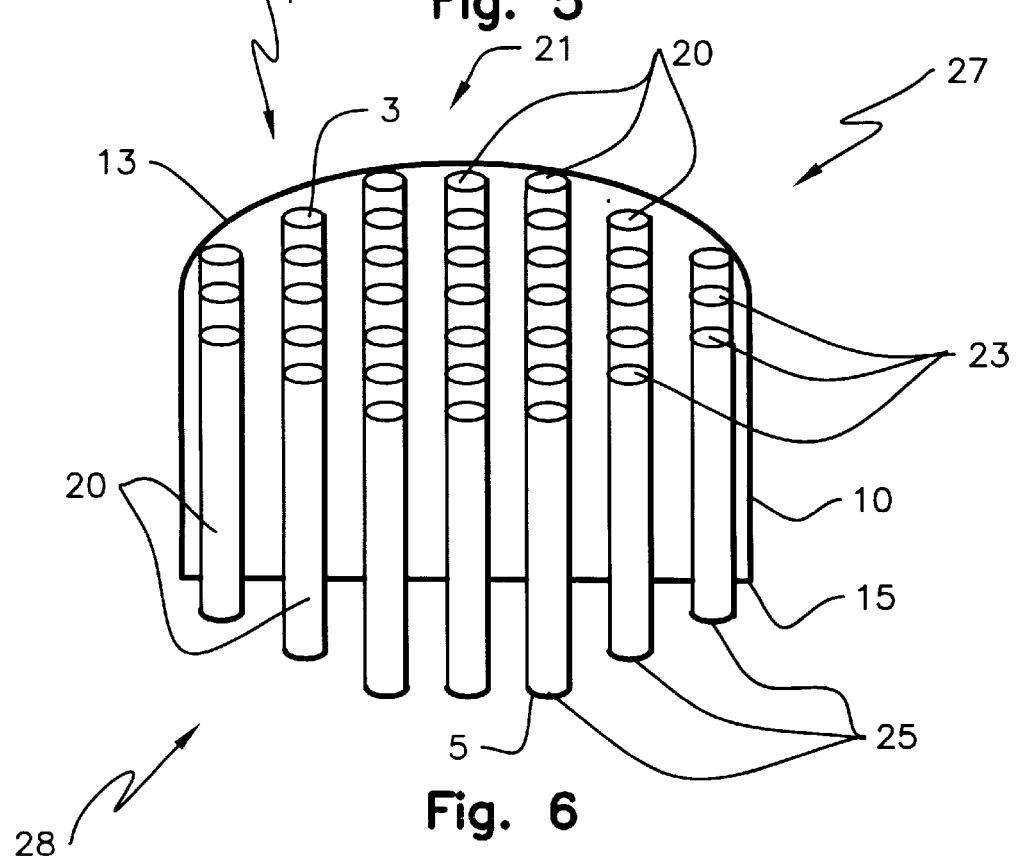
FIG. 6 is a section from FIG. 5 showing the interconnection bundle with bundle first and second end, sheath, the plurality of fibers with fiber first and second ends.
Figure 7:
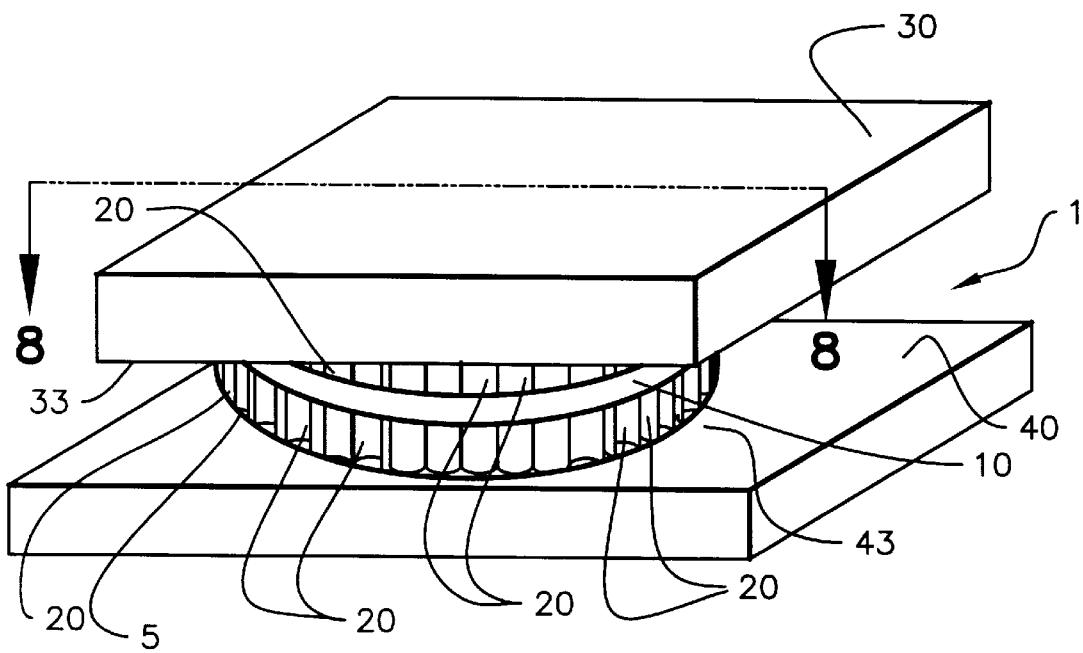
FIG. 7 is illustrative of an interconnection bundle shown fibers, sheath, bundle second end, chip and PCB. The interconnection bundle is affixed by solder means, including wave solder, at bundle first and second ends to a chip mounting surface and a PCB mounting surface respectively.
Figure 8:
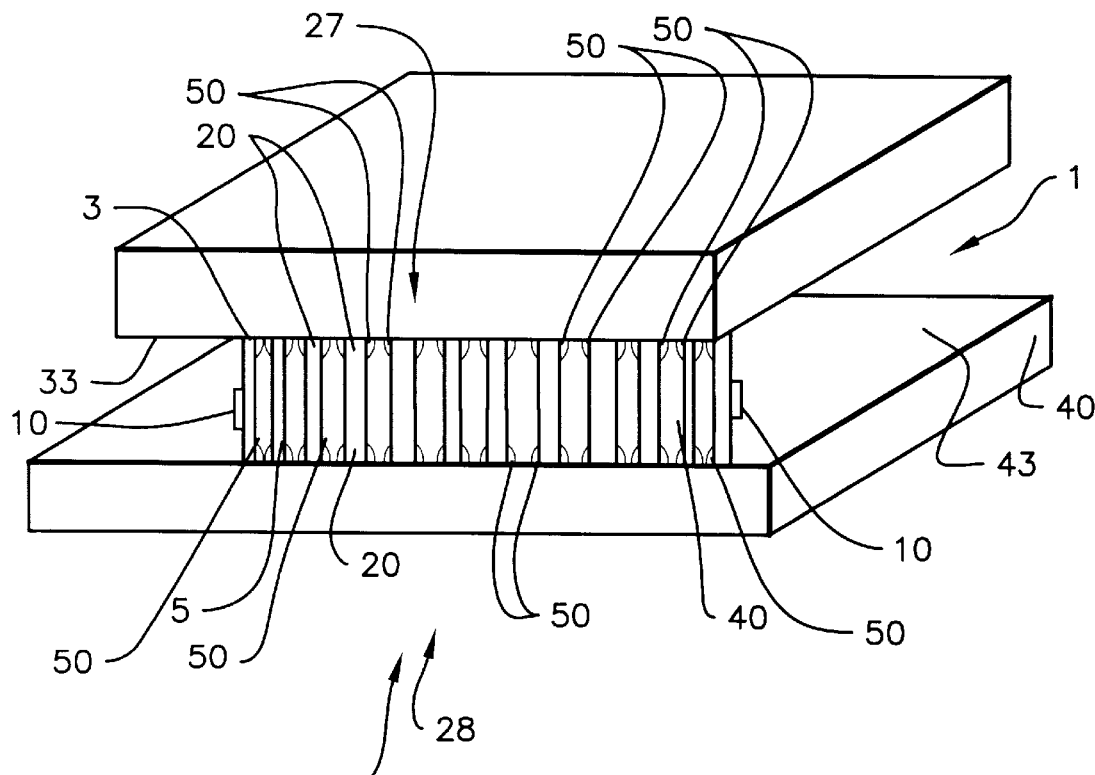
FIG. 8 is a section from FIG. 7 illustrating the discrete fibers or wires ammassed to compose the plurality of fibers or wires. Illustrated is a connection means in the form of a solder means between bundle first and fiber first ends and the chip at a chip mounting surface and bundle second and fiber second ends and the PCB at a PCB mounting surface.
Figure 9:
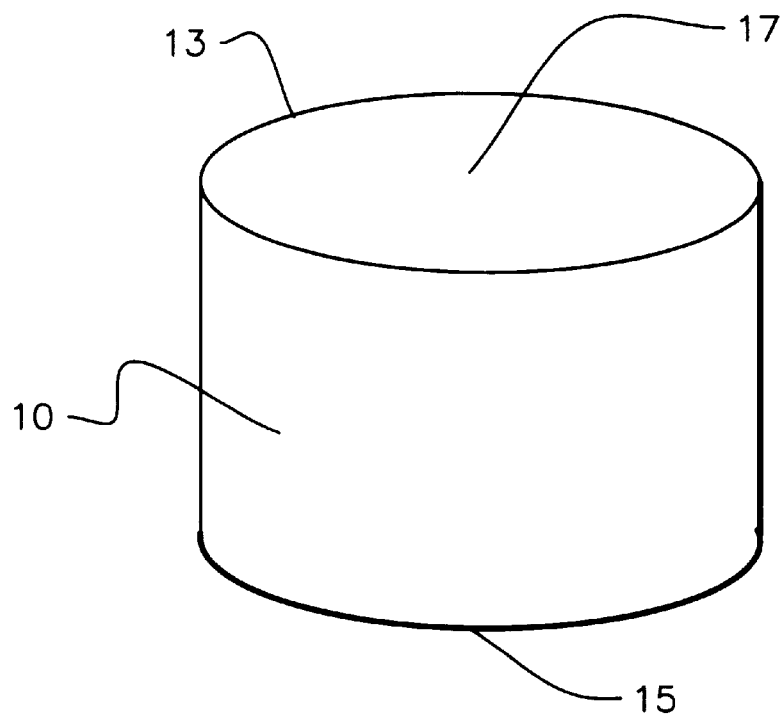
FIG. 9 illustrates a sheath in the simple configuration of a metal tube having a sheath first and second end and aperture.
Figure 10:
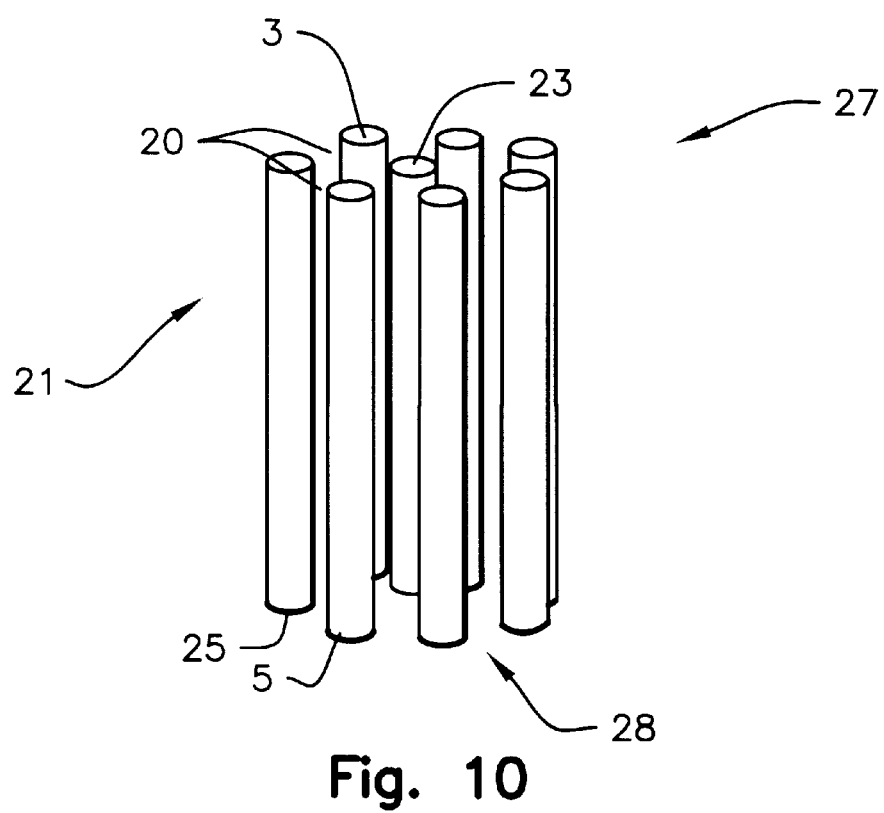
FIG. 10 illustrates an alternative embodiment of the interconnection bundle composed of a plurality of fibers or wires without a sheath.
Figure 11:
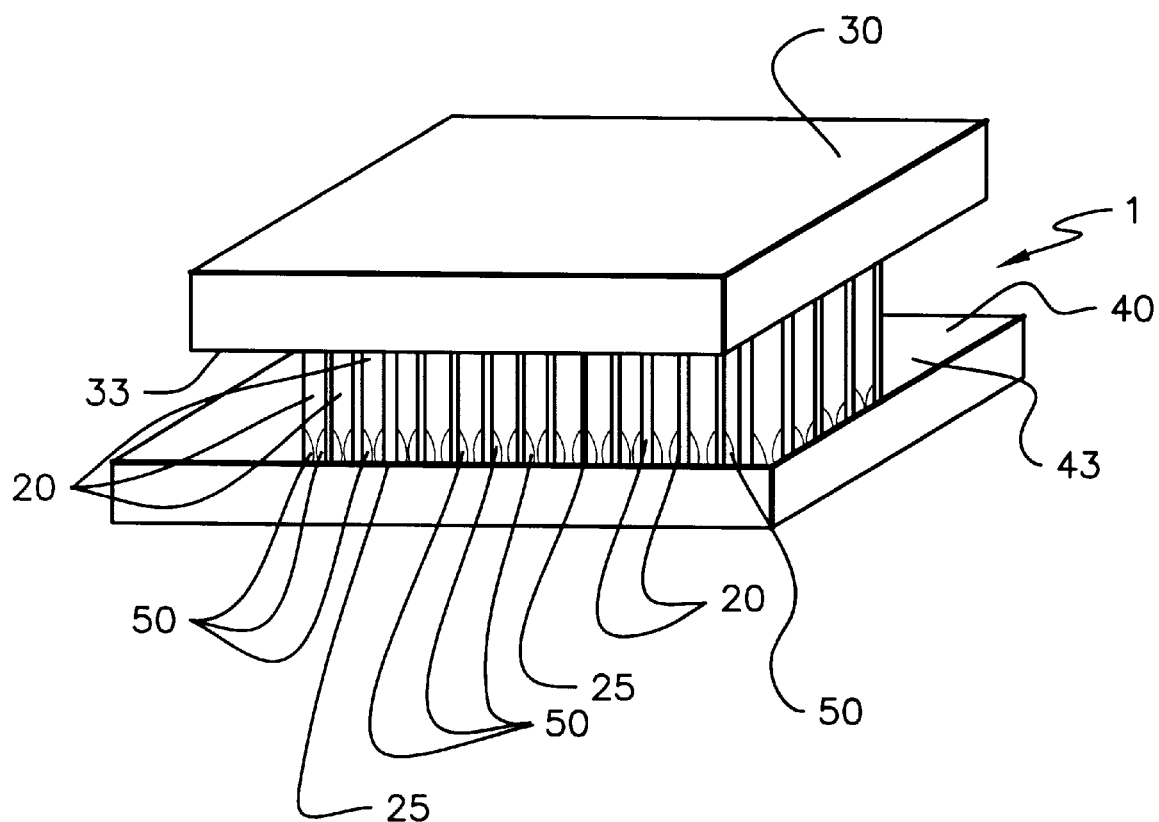
FIG. 11 illustrates the interconnection bundle of FIG. 10 or the interconnection bundle of FIG. 7 with sheath removed, mounted by connection means comprised of solder means 50 to a chip mounting surface at the bundle first end and to a PCB mounting surface at the bundle second end.

The apparatus disclosed herein is illustrated in FIG. 5 through 14. The apparatus as shown in FIGS. 5 and 6 illustrates and is the preferred embodiment of an interconnection bundle 1 having a bundle first and second end 3, 5. Fibers 20 having fiber first and second ends 23, 25 are ammassed into a plurality of fibers 21 with the plurality of fibers 21 contained within a sheath 10, shown in FIGS. 5 through 9, having a sheath first and second end 13, 15 and a sheath aperture 17 extending from the sheath first to the sheath second end 13, 15. The plurality of fibers 2 has a plurality of fibers first and second end 27, 28. The bundle first end 3, by presentation of the fiber first ends 23 and the plurality of fibers first end 27, is received for solder connection by solder means to a chip 30 at a chip mounting surface 33 wherein the fiber first ends 23 are connected by solder means to a chip mounting surface 33. The bundle second end 5, by presentation of the fiber second ends 25 and the plurality of fibers second end 27, is received for solder connection by solder means to a printed circuit board 40 at a printed circuit board mounting surface 43 wherein the fiber second ends 25 are connected by solder means to the printed circuit board mounting surface 43. The fibers 20, intermediate the fibers first and second ends, 23, 25 remain discretely separate from each other so that stresses will act separately on each fiber 20 in response to expansion or contraction experienced by either the chip 30 at the chip mounting surface 33 or by printed circuit board 40 at the printed circuit board mounting surface 43. In the preferred embodiment the fiber first ends 23, plurality of fibers first end 27 and bundle first end 3 terminate in a common plane, as shown in FIGS. 5, 6 and 7, to facilitate the connection, by connection means including solder means, to the chip mounting surface 33 as shown in FIGS. 7 and 8. The fiber second ends 23, plurality of fibers second end 27 and bundle second end 5 terminate in a common plane as shown in FIGS. 5, 6 and 10, to facilitate the connection, by connection means including solder means, to the printed circuit board mounting surface 43 as shown in FIGS. 7 and 8. In an alternative embodiment the fiber first ends 23, plurality of fibers first end 27 and bundle first end 3 terminate in a surface to be received by the surface configuration of a chip mounting surface 33 which may be other than planar in configuration. The fiber second ends 23, plurality of fibers second end 27 and bundle second end 5 terminate in a surface to be received by the surface configuration of a printed circuit board mounting surface 43 which may be other than planar in configuration such as may be required for chip configurations as described by Akira Ishikara.

The interconnection bundle 1 will be formed and employed by accumulating, by means, fibers 20, having fiber first and second ends 23, 25 such that the individual fibers 20, in the preferred embodiment, are parallel, the accumulated fibers 20 forming a plurality of fibers 21; the plurality of fibers 21 having a plurality of fibers first and second end 27, 28; enclosing the accumulated plurality of fibers 21 with enclosing means including a metal sheet or tube to form a sheath 10 having a sheath first and second end 13, 15 and sheath aperture 17 which receives the plurality of fibers 21; cutting the sheath 10 and fibers 20 by milling and machining, including polishing, means causing fiber first ends 23, plurality of fibers first end 27 and bundle first end 3 to terminate in a common plane to facilitate the connection, by solder means, to the chip mounting surface 33; cutting by milling and machining, including polishing, means the sheath 20 and fibers 20 causing fiber second ends 25, plurality of fibers second end 28 and bundle second end 5 to terminate in a common plane to facilitate the connection, by solder means, to the printed circuit board mounting surface 43; affixing by connecting means, including solder means, the interconnection bundle first end 3 and plurality of fibers first end 27 to the chip mounting surface 33; affixing by connection means including solder means, the interconnection bundle second end 5 and plurality of fibers second ends 28 to the printed circuit board mounting surface 43.

In an alternative embodiment and process the interconnection bundle 1 will be formed by the plurality of fibers 21 encompassed by a sheath 10, as shown in FIG. 9, having a sheath first and second end 13, 15 and a sheath aperture 17 extending from the sheath first to the sheath second end 13, 15; the sheath aperture receiving at the sheath first end the plurality of fibers 21. As an alternative embodiment the plurality of fibers 21 will not be enclosed by a sheath as shown in FIG. 10.

An additional embodiment is the configuration of the interconnection bundle 1 wherein the fibers 20 of a plurality of fibers 21 are contained in an insulating matrix 100 wherein one or a plurality of fibers are electrically insulated from one or a plurality of fibers in the plurality of fibers 21; the plurality of fibers 21 and matrix 100 compose a composite material wherein each discrete fiber 20 constituted both a portion of the interconnection bundle 1, as an interconnection medium between chip and PCB, and one or a plurality of the fibers compose one or a plurality of signal conductors between one or a plurality of signal connections at a chip and one or a plurality of electrical connections at a PCB. The one or a plurality of the fibers composing one or a plurality of signal conductors received at the chip mounting surface having chip mount surface signal connection means; the one or a plurality of the fibers composing one or a plurality of signal conductors received at the PCB mounting surface having PCB mounting surface electrical connection means.

While a preferred embodiment of the present invention has been shown and described, it will be apparent to those skilled in the art that many changes and modifications may be made without departing from the invention in its broader aspects. The appended claims are therefore intended to cover all such changes and modifications to fall within the true spirit and scope of the invention.

I claim:

1. An interconnection bundle for mounting a chip on a PCB to reduce stresses caused by thermal expansion mismatch between the chip and the PCB comprising:
    a. a bundle first and second end; fibers having fiber first and second ends further comprising a plurality of fibers;
    b. the plurality of fibers has a plurality of fibers first and second end;
    c. the bundle first end and plurality of fibers first end affixed by means to a chip, having a chip mounting surface, at the chip mounting surface; the bundle second end and plurality of fibers second end affixed by means to a PCB, having a PCB mounting surface, at the PCB mounting surface such that the plurality of fibers flexibly interconnecting the chip and PCB such that upon expansion or contraction of the chip relative to the PCB, said plurality of fibers flex to reduce stresses resulting from the expansion or contraction of the chip.

2. An apparatus of claim 1 further comprising:
  a. the fiber first ends and plurality of fibers first end terminate in a common plane; the fiber second ends and plurality of fibers second end terminate in a common plane;
  b. the plurality of fibers contained within a sheath, having a sheath first and second end and a sheath aperture extending from the sheath first to the sheath second end.

3. An apparatus of claim 2 further comprising:
  a. the fibers are parallel;
  b. the fibers of the plurality of fibers are contained in an insulating matrix wherein one or a plurality of fibers are electrically insulated from one or a plurality of fibers in the plurality of fibers; the plurality of fibers and matrix compose a composite material wherein each discrete fiber constitutes both a portion of the interconnection bundle, as an interconnection medium between chip and PCB, and one or a plurality of the fibers compose one or a plurality of signal conductors between one or a plurality of signal connections at a chip and one or a plurality of electrical connections at a PCB; the one or a plurality of the fibers composing one or a plurality of signal conductors received at the chip mounting surface having chip mount surface signal connection means; the one or a plurality of the fibers composing one or a plurality of signal conductors received at the PCB mounting surface having PCB mounting surface electrical connection means.

4. A method of composing the apparatus of claim 1 comprising:
  a. forming the interconnection bundle by accumulating, by means, fibers, having fiber first and second ends, forming the fibers into a plurality of fibers having a plurality of fibers first and second end.

5. A method of claim 4 further comprising:
  a. accumulating by means, fibers such that the individual fibers are parallel forming a plurality of fibers;
  b. enclosing the plurality of fibers, with enclosing means, with a sheath having a sheath first and second end and a sheath aperture; the plurality of fibers received by the sheath aperture;
  c. cutting, with milling and machining means, the sheath and fibers causing fiber first ends and plurality of fibers first ends to terminate; cutting, with milling, machining and polishing means, the sheath and fibers causing fiber second ends and plurality of fibers second end to terminate.

6. A method of claim 5 further comprising:
  a. the fiber first ends and plurality of fibers first end terminating in a common plane; the fiber second ends and plurality of fibers second end terminating in a common plane.

7. A method of claim 4 further comprising:
  a. connecting, by connecting means, the bundle first end 3, the fiber first ends and plurality of fibers first end to a chip, having a chip mounting surface, at the chip mounting surface; connecting, by connecting means, the bundle second end, fiber second ends and plurality of fibers second ends to a printed circuit board having a printed circuit board mounting surface at the printed circuit board mounting surface.

8. A method of claim 7 wherein the connecting means is solder means.

9. A method of claim 5 further comprising:
  a. connecting, by connecting means, the bundle first end, the fiber first ends and plurality of fibers first end to a chip, having a chip mounting surface, at the chip mounting surface; connecting, by connecting means, the bundle second end, fiber second ends and plurality of fibers second ends to a printed circuit board having a printed circuit board mounting surface at the printed circuit board mounting surface.

10. A method of claim 9 wherein the connecting means is solder means.

11. A method of designing an optimal interconnection bundle of claim 1 comprising:
  a. determining the heat flow paths and structural load paths through the system by modeling solder joints, lead wires, and plated through holes using nonlinear FEM;
  b. avoiding numerical instability by spreading the load over a closely clustered group of node points.

12. The method of claim 11 further comprising the use of two dimensional modeling.

13. The method of claim 11 further comprising the use of three dimensional modeling.

14. The method of claim 11 further comprising:
  a. superimposing the effects of vibration strain and thermal strain.

15. The method of claim 14 using the superposition scheme of Miner's rule.

* * * * *